(12) United States Patent
Clark et al.

(10) Patent No.: US 11,036,454 B2
(45) Date of Patent: Jun. 15, 2021

(54) DISPLAY CONTROL

(71) Applicant: HEWLETT-PACKARD DEVELOPMENT COMPANY, L.P., Spring, TX (US)

(72) Inventors: Alexander Wayne Clark, Spring, TX (US); Ann Alejandro Villegas, Spring, TX (US); Hsing-Hung Hsieh, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/964,382

(22) PCT Filed: Mar. 22, 2018

(86) PCT No.: PCT/US2018/023793
§ 371 (c)(1),
(2) Date: Jul. 23, 2020

(87) PCT Pub. No.: WO2019/182600
PCT Pub. Date: Sep. 26, 2019

(65) Prior Publication Data
US 2020/0409645 A1 Dec. 31, 2020

(51) Int. Cl.
*G06F 3/14* (2006.01)
*G06F 1/16* (2006.01)
(Continued)

(52) U.S. Cl.
CPC .......... *G06F 3/1423* (2013.01); *G06F 1/1647* (2013.01); *G06F 1/3218* (2013.01);
(Continued)

(58) Field of Classification Search
CPC ...... G06F 1/1601; G06F 1/1616; G06F 1/162; G06F 1/1624; G06F 1/1635;
(Continued)

(56) References Cited

U.S. PATENT DOCUMENTS

| 9,118,772 B2 | 8/2015 | Xiong et al. |
| 2002/0109662 A1 | 8/2002 | Miller |

(Continued)

FOREIGN PATENT DOCUMENTS

| KR | 101381637 B1 | 4/2014 |
| WO | WO-2014110567 | 7/2014 |

*Primary Examiner* — Nelson M Rosario
(74) *Attorney, Agent, or Firm* — Brooks, Cameron & Huebsch PLLC

(57) ABSTRACT

Example implementations relate to display control. In some examples, a computing device may include a first processing resource, a second processing resource, a first display controlled by the first processing resource, and a second display storable in a first position within a pocket of the first display and controlled by the second processing resource. The second processing resource may provide notification data content to the second display when the second display is stored within the first position and the first processing resource of the computing device is in a non-active mode. The second processing resource may share control of the second display with the first processing resource when the second display is in a second position extended from the first display and while the computing device is in an active mode.

14 Claims, 10 Drawing Sheets

(51) Int. Cl.
  *G06F 1/3218* (2019.01)
  *G06F 1/3234* (2019.01)
  *G09G 3/3208* (2016.01)

(52) U.S. Cl.
  CPC ......... *G06F 1/3265* (2013.01); *G09G 3/3208* (2013.01); *G09G 2330/022* (2013.01); *G09G 2360/04* (2013.01); *G09G 2370/06* (2013.01); *H01L 2251/5323* (2013.01)

(58) Field of Classification Search
  CPC .... G06F 1/1647; G06F 1/1649; G06F 1/1654; G06F 1/1662; G06F 1/1666; G06F 1/1675; G06F 1/1679; G06F 1/1681; G06F 1/1683; G06F 1/1696; G06F 3/1446; G06F 2200/1612; G06F 2200/1614; G06F 3/1423; H04M 1/0266; H04M 1/0235; H04M 2250/16; G09G 2330/022; G09G 3/32; G09G 3/3208
  See application file for complete search history.

(56) References Cited

U.S. PATENT DOCUMENTS

| | | | |
|---|---|---|---|
| 2006/0082518 A1* | 4/2006 | Ram | G06F 3/1446 345/1.1 |
| 2006/0214871 A1 | 9/2006 | Iwamura | |
| 2007/0247798 A1 | 10/2007 | Scott | |
| 2011/0050543 A1 | 3/2011 | Chien | |
| 2014/0342782 A1 | 11/2014 | Karmanenko et al. | |
| 2015/0220299 A1 | 8/2015 | Kim | |
| 2016/0026381 A1 | 1/2016 | Kim et al. | |

* cited by examiner

DISPLAY CONTROL

BACKGROUND

Computing devices may include multiple displays. The multiple displays can present content including images, text, and/or video to a user. To use a second display as an extended workspace on a computing device involves receiving output from the operating system (OS) and associated OS display drivers directly. Displays may also be used to present notifications to a user while a device is not actively being used. Operating systems and associated OS display drivers may enter a non-active mode, such as a sleep mode, to conserve electrical energy. In such a mode, receiving and displaying notifications may cause the operating system to return to an active mode, e.g. "wake" the computing device, thus consuming additional electrical energy.

DETAILED DESCRIPTION

Figure 1:
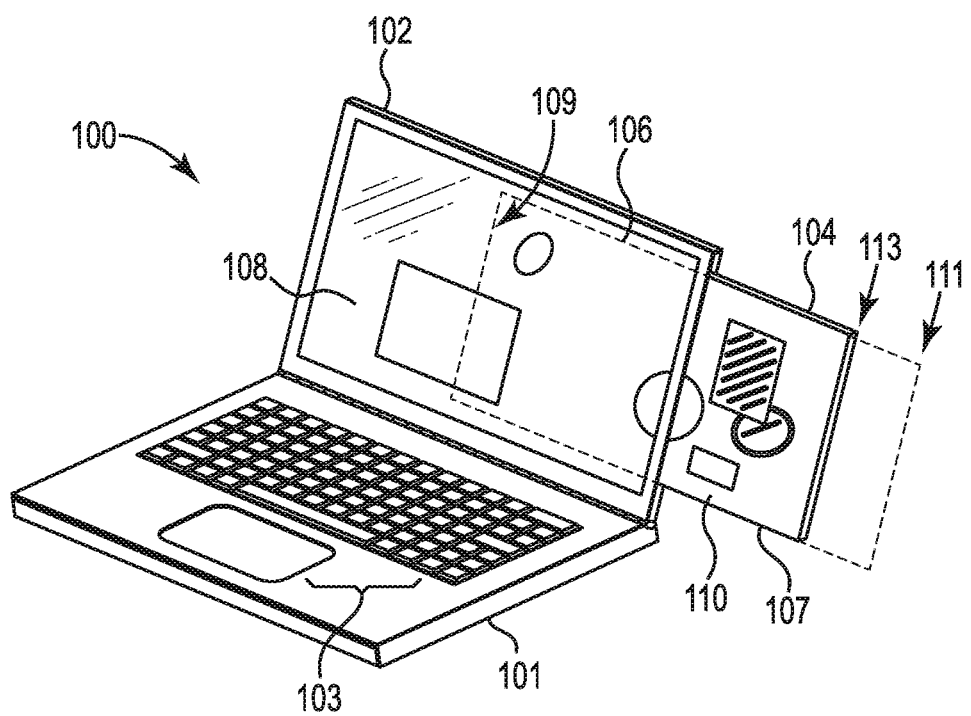
FIG. 1 illustrates an example front view of a computing device including a first display and a second display, storable within a pocket of the first display, the first display is controlled by a first processing resource and the second display has an independent second processing resource which shares control of the second display when extended from the pocket.

Examples described herein relate to display control such as content control between multiple displays. In one example, a computing device may include a first display and a second display. The second display may be storable in a pocket of a first display. The first display may be controlled by a first processing resource, e.g., primary processing resource, coupled to an operating system (OS) and associated OS display driver of the computing device. The second display may be controlled by an independent, second processing resource. In some examples, the second processing resource is a smaller secondary processor which uses less electrical energy than the first processing resource, e.g., saves on power consumption, while the first processing resource is placed in a "non-active mode" such as a "sleep" or "hibernate" mode.

As used herein, the term "first processing resource" is intended to mean the primary processing resource of a computing device. The primary processing resource may be a central processing unit (CPU) or processing core to a computing device which has primary responsibility for communicating with the operating system of a computing device. Further, as used herein, "an independent second processing resource" is intended to mean a secondary processor, smaller than and separate from the first processing resource. For example, the second processing resource may be an ARM® processing chip that is separate and smaller than the first processing resource. Alternatively, the second processing resource may be a controller (e.g., field programmable gate array (FPGA), multi-point control unit (MCU), etc.), application specific integrated circuit (ASIC), etc., that is separate and smaller that the primary processing resource.

The second processing resource is to operate the second display independently from the first processing resource when the computing device is in a non-active mode. For example, the second processing resource is to operate the second display without use of an operating system (OS) or OS display driver of the computing device. In some examples, the second processing resource is to disconnect the second display from circuitry to the first processing resource and OS display driver and is to independently generate graphics to display content on the second display when the second display is in a first position and when computing device is in a non-active mode. By further example, the second processing resource is to share control of the second display with the first processing resource and associated OS display driver when the second display is in a second position extended from the first display and while the computing device is in an active mode to provide an extended workspace on the computing device.

As used herein, the term "display" is intended to mean hardware, circuitry, logic and a user interface, e.g., touch screen, to present content to a user. Thus, use of the term "display" herein is intended to include a user interface in the form of a screen capable of displaying information to a user. One example of a display includes a display having a light emitting diode (LED) screen type. Another example of a display may include a display having an organic light emitting diode (OLED) screen type. Still another example of a display may include a display having a dual side emission OLED screen type as such technologies are recognized in the display industry. Examples, however, are not limited to these screen type technologies and other screen type technologies may be considered within the scope of this disclosure.

As used herein, "active mode" (also referred to as a "full on" state) is intended to mean a power setting to a computing or electronics device during which a power supply is provided to all components of the computing or electronics device. As used herein, the term "non-active mode" (also sometimes referred to as "non-active state") is intended to mean a power setting on a computing or electronics device that utilizes relatively less power than a full on state of the computing or electronics device. A "non-active mode" may reduce electrical energy consumption to the device by disconnecting certain components of the device that consume electrical energy, such as transmitters, processing resources, displays, etc. One example "non-active mode" includes an "airplane mode" where a transmitter component to the device may be disconnected from operation and may resultingly decrease consumption of electrical energy. Another example of a "non-active mode" includes a "sleep mode" where certain functions of a processing, networking, and/or display resource may be disconnected from operation and may resultingly decrease consumption of electrical energy. Conserving available electrical energy by reducing electrical energy consumption may be important to mobile computing devices with a finite battery life.

As such, a "non-active mode" may restrict the use of certain capabilities of a device which are otherwise available in an "active mode" of a computing device. As used herein, a "computing device" is intended to include mobile computing devices such as a cellphone, tablet, notebook, laptop, convertible, etc. For example, a sleep mode of the computing device may utilize less power than an "active mode" by deactivating a primary processing resource, a primary memory resource, a display resource, and/or a networking resource. In this example, the computing device can utilize the primary processing resource, primary memory resource, display resource, and/or networking resource during an "active mode", but may not utilize the primary processing resource, primary memory resource, display resource, or the networking resource during a sleep mode as to conserve electrical energy.

In examples described herein, a second processing resource, e.g., microcontroller, is independent of a first processing resource, e.g., primary processing resource. The first processing resource is connected to an operating system (OS) and associated OS display driver of a computing device and as such consumes more electrical energy than the second processing resource. The second processing resource is to generate graphics and is to control certain content, such as filtered messaging, filtered scheduling, time and/or event notifications, etc., to a second display. The second processing resource is to control content to the second display while the second display is stored in a pocket of a first display of the computing device and while the computing device is in a "non-active mode". In this way, the second processing resource can control content displayed to the second display of the computing device without a first processing resource, e.g., primary processing resource, connected to the operating system (OS) and associated OS display driver having to return, e.g., "wake", to an active state and/or wake other subsystems, e.g., displays, network connections, etc.

As used herein, the term "subsystem" to a computing device is intended to mean a component, or group of components working in conjunction, to provide a particular function for the computing device. For example, a messaging function on the computing device may include a display, a network connection and a memory resource or buffer. A storage function on a computing device may include a memory subsystem to store and retrieve data, but not involve the use of a display capability of the computing device. Thus, in some examples, a subsystem may act to perform its function using select components of a computing device without involving all of the available components of the computing device. However, a subsystem may include use of a group of components working to achieve the subsystem's function. In the messaging function example, a memory component, a network connection component to access a network such as an internet, local area network (LAN) and/or wide area network (WAN) connection, a display component, and a processing component such as a graphics processing unit and associated display driver, etc., may be used. A selectably connected subsystem, as used herein, is intended to mean the selective and independent connection between components of a subsystem such as a wireless communication component, e.g., transceiver, communication with a wireless network connection, e.g., mobile access point, as possible in a wireless connection to an Internet of Things (IoT) device. Not forcing a computing device to return to an "active mode" ("full on state") to perform certain subsystem functions may be particularly important in mobile computing environments where mobile computing devices have a finite battery life.

In one example, the second processing resource is to share control of the second display with the first processing resource when the second display is in a second position extended from the first display and while the computing device is in "active mode". In this example, the first processing resource is connected to the operating system (OS) and associated OS display driver and is connected to control content to the second display via a display output combinational switching logic of the second processing resource when in active mode. As used herein, display output combinational switching logic is intended to mean a circuit such as a multiplexer to switch one of several input lines (e.g., data paths) to a single common output line (e.g., data path), or several input data paths to fewer output data paths, by the application of control logic. In one example, the first processing resource and the second processing resource may each have a data path to the second display that is being controlled by the control logic of the combination switching logic. In some examples, the control logic controls the combinational switching logic such that the second display is only communicating with and receiving data from the first processing resource such as while the second display is fully extended from the pocket (e.g., second position described herein) and the computing device is in an active mode. In this manner, the second display may provide an extended workspace for the computing device and any content within the operating system environment (windows, applications, mouse cursor, etc.) may be dragged onto the extendable second display from the first display. In this example, the operating system registers two displays; the first display, and the second display. In another example, the control logic controls the combinational switching logic such that the second display is only communicating with and receiving data from the second processing resource, e.g., while the second display is fully in the pocket (e.g., first position as described herein) and the computing device is in a non-active mode. In another example, the control logic controls the combinational switching logic such that the second display is communicating with and receiving data from both the first processing resource and the second processing resource concurrently such as while the second display is in a partially extended position from the pocket (e.g., third position described herein) and the computing device is in an active mode. More detail is provided on this latter example (also referred to as "hybrid") in connection with FIG. 2 below.

FIG. 1 illustrates an example front view of a computing device 100 including a first display 102 and a second display 104, storable within a pocket 106 of the first display 102. In one example the first display 102 is a light emitting diode (LED) display and the second display 104 is an organic light emitting diode (OLED) display. In this example, a thin form factor to the OLED may contribute to an ease of storing the second display within the pocket 106 of the first display 102. The computing device 100 may have a body portion 101 connected to a housing for the first display 102. The body portion 101 may include a user interface 103 such as input keys and/or touch pad. The first display 102 may include a user interface as well in the form of a touch sensitive screen to the first display 102. The body portion 101 of the computing device 100 may include a main memory resource (e.g., a primary memory resource), a first processing resource (e.g., primary processing resource), operating system (OS) and associated OS display driver as shown and discussed in connection with FIG. 5. The first display 102 is controlled by the first processing resource, e.g., primary processing resource (shown as 320 in FIG. 3), connected to the OS and associated OS display driver to present content 108 to the first display. The second display 104 is controlled by an independent second processing resource, e.g., microcontroller (shown as 328 in FIG. 3). In this example, the second processing resource is to share control of the second display 104 when extended from the pocket 106 of the first display 102.

In the example of FIG. 1, the computing device 100 is in active mode and the second display 104 is shown extended from the pocket 106 in the first display 102. In the active mode, the second processing resource is to share control of the extendable second display with the first processing resource. The first processing resource is connected to the operating system (OS) and associated OS display driver of the computing device 100. Accordingly, the second display 104 is shown providing an extended workspace for content 110 on the second display 104 together with content 108 on the first display 102. In this manner, content within the operating system environment (windows, applications, mouse cursor, etc.) may be dragged onto the extendable second display 104 from the first display 102 and the operating system registers two displays; the first display 102 and the second display 104. The second processing resource is to share control of the second display via a display output combination switching logic described in FIG. 4.

In the example of FIG. 1, the second display 104 may be fully retracted into the pocket 106 of the first display 102 in a first position 109 so as not to serve as an extended workspace for the computing device 100. The second display may be fully extended from the pocket 106 in the first display 102 to a second position 111 to provide a fullest extended workspace for the computing device 100. Additionally, the second display 104 may be partially extended some fraction of a full area of the second display 104 to a third position 113 to serve as a partial extended workspace for the computing device 100. For example, sixty percent (60%) of a full area of the second display 104 may be extended from the pocket 106 of the first display 102 to serve as an extended workspace for the computing device 100.

Figure 4:
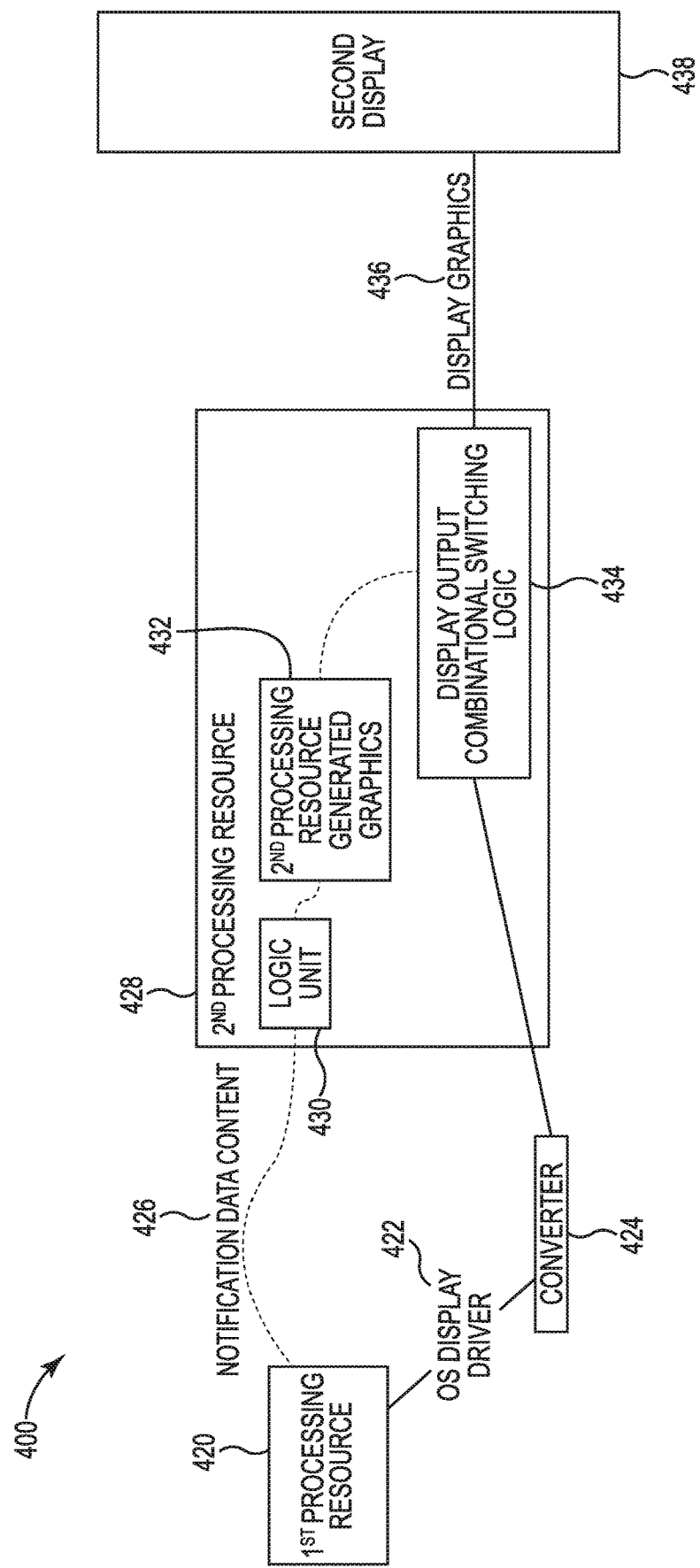
FIG. 4 illustrates an example diagram of a first processing resource sharing control of a second display of a computing device with a second processing resource associated with the second display of the computing device via a display output combinational switching logic.
Figure 5:
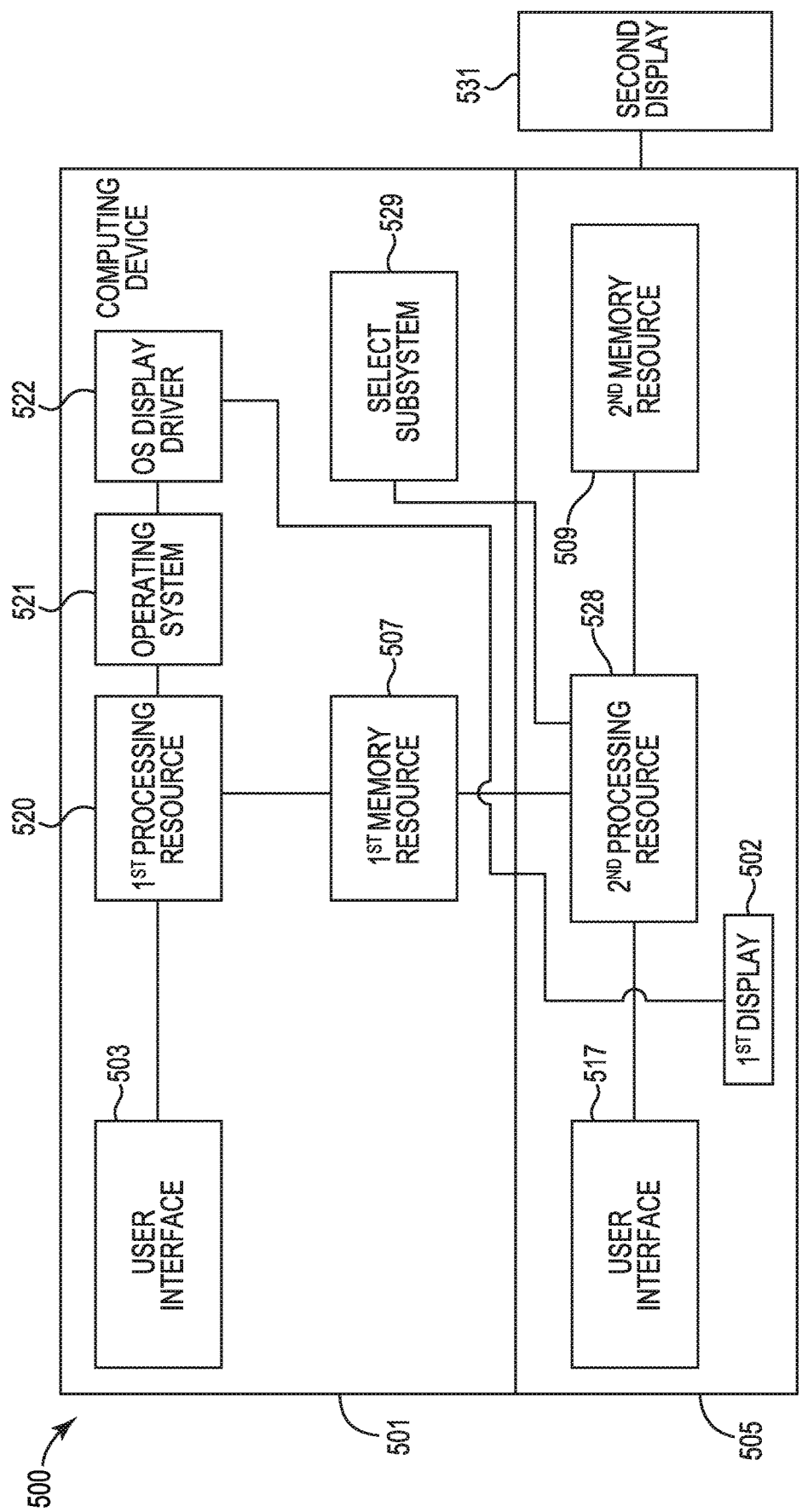
FIG. 5 is a block diagram of an example computing device for display control having a body portion containing a first processing resource and a housing having a first display with an independent second processing resource in the housing to control a second display that is storable in the housing.

The second display 104 is controlled by an independent second processing resource, e.g., microcontroller, when the second display is fully retracted into the pocket 106 of the first display 102. In this example, the second processing resource is to disconnect the operating system (OS) and associated OS display driver from the second display 104. When the second processing resource is to share control of content to the second display 104 with the first processing resource, OS and associated OS display driver, the second processing resource is to provide content to the second display 104 through display output combinational switching logic as shown in FIG. 4. For example, when extended in a second position from the pocket 106 of the first display 102, the second processing resource is to provide content to the second display 104 through display output combinational switching logic as shown in FIG. 4. As shown in FIG. 5, in one example, the independent second processing resource, e.g., microcontroller, is located within a housing of the first display 102.

Figure 2:
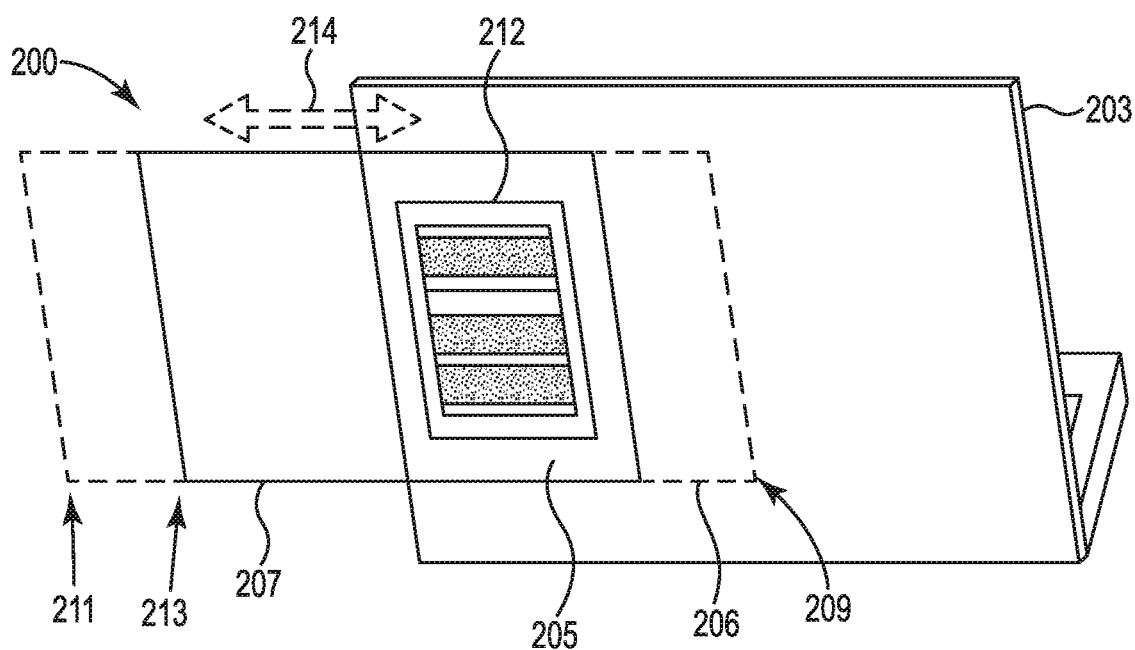
FIG. 2 illustrates an example of a rear view of a computing device showing an outside housing of a first display and content presented on a second display, storable within a pocket of the first display, the second display controlled by an independent processing resource.

In one example, the second display 104 is on a sliding mechanical frame 107. In this example, the second display 104 can be connected to a frame 107 having sliding rails that allow the second display 104 to move back and forth from and into the pocket 106 of the first display 102. In this manner, the second display 104 can extend from and retract into (shown as 214 in FIG. 2) the pocket 106 in a housing of the first display 102. The second processing resource is coupled to a logic unit (shown in FIGS. 3 and 4) to receive an input to indicate a position of the second display 104, e.g., a first position 109 (fully stored within the pocket 106 of the first display 102), a second position 111 (fully extended from the first display 102), and a third position 113 (partially extended some percentage of a full area of the second display 104 from the first display 102). In this example, the logic unit (shown in FIGS. 3 and 4) is to receive an input from a mechanical switch or connector built into the mechanical frame 107, e.g., sliding rails, between the second display 104 and the pocket 106 in the first display 102. For example, the logic unit (shown in FIGS. 3 and 4) may receive input relating to the position of the second display 104 from optical encoders, rotational magnetic sensors, and/or similar components, as one skilled in the art would understand, built into the mechanical frame 107, FIG. 2 illustrates an example of a rear view of a computing device 200 showing an outside surface to a housing 203 of a first display (such as first display 102 shown in FIG. 1). As shown in the example of FIG. 2, content 212 is provided on a second display 205 in a manner that is viewable from the outside surface of the housing 203 of the first display, e.g., in a manner that may be public facing. In one example, the first display is a light emitting diode (LED) display and the second display 205 is an organic light emitting diode (OLED) display. In this example, a thin form factor available with an OLED display may contribute to an ease of storing the second display 205 within a pocket 206 of the housing 203 of the first display without significantly increasing a thickness of the housing 203 relative to a housing not having a pocket to store a second display. In certain examples, the second display 205 may be a dual sided display. In such examples, the content 212 shown on the second display 205 that is viewable from an outside surface of the housing 203 may be on a second side of the second display 205 from content on a first side of the second display (e.g., content 110 on second display 104 shown in FIG. 1). Further, in one example, a second display 205 that is a dual sided display is a dual side emission, organic light emitting diode (OLED) display. Examples, however, are not limited to a dual sided, or OLED type displays.

As shown in the example rear view of the computing device 200 of FIG. 2, the second display 205 is storable within a pocket 206 to a housing of the first display (e.g., first display 102 shown in FIG. 1). As with the example of FIG. 1, the second display 205 in FIG. 2 can be on a mechanical frame 207, e.g., sliding rails. In this example, the second display 205 can be connected to a mechanical frame 207 having sliding rails that allow the second display 205 to move back and forth from and into the pocket 206 of the housing 203 of the first display (e.g., first display 102 shown in FIG. 1). In this manner, the second display 205 can extend from and retract into 214 the pocket 206 in a housing 203 of the first display.

In the example of FIG. 2, the computing device 200 includes a first display (shown in FIG. 1) viewable from a front side of the housing 203 and a second display 205, storable within a pocket 206 of the housing 203 of the first display. The computing device 200 may have a body portion (shown as 101 in FIG. 1) connected to the housing 203 of the first display. As in the example of FIG. 1, the body portion may include a user interface such as input keys and/or touch pad. The body portion of the computing device 200 may include a main memory resource (e.g., a primary memory resource), a first processing resource (e.g., primary processing resource), operating system (OS) and associated OS display driver as shown and discussed in connection with FIG. 5. In this example, the first display is controlled by the first processing resource, e.g., primary processing resource (shown as 320 in FIG. 3), connected to the OS and associated OS display driver to present content to the first display.

Figure 3:
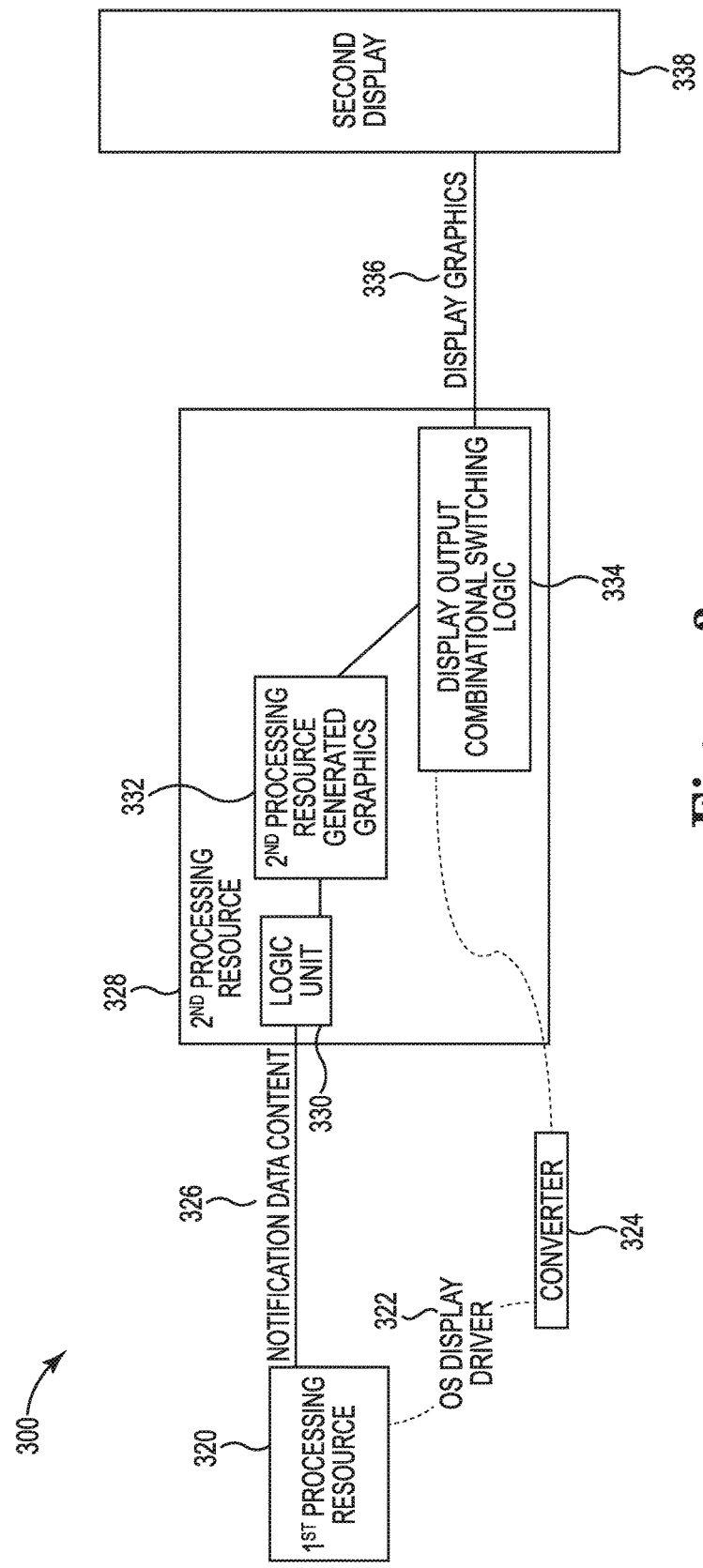
FIG. 3 illustrates an example diagram of a first processing resource allowing notification data content to be passed to a second processing resource to control content to a second display of a computing device while an operating system (OS) display driver associated with the first processing resource is disconnected from the second display.

In the example of FIG. 2, the second display 20 is controlled by an independent second processing resource, e.g., microcontroller (shown as 328 in FIG. 3). In some examples, the independent, second processing resource is in the housing 203 of the first display. The second processing resource is to share control of the second display 205 when extended from the pocket 206 in the housing 203 of the first display. In the example of FIG. 2, the computing device 200 may be in active mode and the second display 205 as shown is extended from the pocket 206 in the housing 203 of the first display. In the active mode, the second processing resource is to share control of the extendable second display with the first processing resource. The first processing resource is connected to the operating system (OS) and associated OS display driver of the computing device 200. As such, in the example of a dual sided second display 205, a first side of the second display 205, viewable from an inside surface of the first display may provide an extended workspace for content on the second display 205 together with content on the first display as described in connection with FIG. 1, In this manner, content within the operating system environment (windows, applications, mouse cursor, etc.) may be dragged onto a first side of the second display 205 from the first display so as to be viewable to a user from the inside surface of the first display, but not viewable on an outside surface of the housing 203 of the second display 205, e.g., not public facing. As in the example of FIG. 1, the second processing resource is to share control of the second display via a display output combination switching logic described in FIG. 4.

In the example of FIG. 2, the second display 205 may be fully retracted into the pocket 206 of the housing 203 of the first display in a first position 209 where a full area of the second display 205 is to be used to present content 212 under the control of the second processing resource. That is the independent, second processing resource is to generate graphics and drive content 212 to the second display 205. In this example the second processing resource is to disconnect the second display 205 from an operating system (OS) and OS display driver associated with the first processing resource. In one example, the content provided to the second display 205, viewable on an outside surface of the housing 203 is notification data content 212. As used herein, "notification data content" is intended to include date, time, weather, filtered or non-filtered emails, filtered or non-filtered calendar events, appointment notices, or a combination thereof. In some examples, the notification data content is to include non-sensitive information and an input can be received via a user interface to the computing device 200 to selectably choose information that the second processing resource is to provide to the second display 205. In this manner, the second processing resource is to protect security settings and network integrity to an internal local area network (LAN), or wide area network (WAN) connected to the first processing resource and having secure or sensitive data associated with the computing device.

In some examples, the second processing resource is to disconnect the second display 205 from an operating system (OS) display driver and connect the second display 205 to a select subsystem based on a position of the second display 205 relative to the pocket 206 of the housing 203. For example, in the example of FIG. 2, the second display may be mounted on a mechanical frame 207 having slidable rails and a position of the second display 205 can signal the second processing resource that an operational mode such as from active mode to non-active mode, e.g., "sleep mode", has occurred. In some examples a position of the second display 205 itself may signal the operational mode. In another example, a position partially extended may signal a dual display mode to contextually control content between a first side, e.g., front side, and a second side, e.g., rear side, of the second display.

As shown in the example of FIG. 2, the second display 205 may be stored in a first position 209, e.g. fully retracted into the pocket 206 in the housing 203 of the first display. The second display 205 may be fully extended from the pocket 206 in the housing 203 of first display to a second position 211. And, the second display 104 may be partially extended some fraction of a full area of the second display 104 to a third position 213. For example, sixty percent (60%) of a full area of the second display 205 may be extended from the pocket 206 in the housing of the first display.

There are multiple methods for determining the position of the second display 205 as it extends from and retracts into 214 the pocket 206 in the housing 203 of the first display. These include but are not limited to sensors such as optical encoders or rotational magnetic sensors. For example, in the case of an optical encoder, alternating color or black and white patterns can indicate incremental measurements along the mechanical frame 207 having sliding rails the second display 205 is connected to. As the patterns, e.g., alternating between black and white, pass under the attached optical encoder, a measured count is increased or decreased depending on extension from and retraction into the pocket 206 in the housing 203 of the first display. For example, the total number of counts detected may directly correspond to the length the second display 205 is extended to. In another example, in the case of the rotational magnetic sensors, one of the rotating gears on a sliding rail can have small magnets embedded within the gear. As the gear rotates, the alternating poles of the magnetics are registered and counted by the magnetic sensor. For example, similar to the optical encoder, a determined number of counts may directly correlate to the position of the second display 205 in the pocket 206 in the housing 203 of the first display. Using these sensors to know the mechanical position of the second display 205 allows control over the second display 205 to be partitioned between the first processing resource and the second processing resource, each resource having control over a respective percentage of display coverage, as discussed herein.

In such examples, the second display 205 can be controlled by the independent second processing resource, e.g., microcontroller, when the second display 205 is fully retracted into the pocket 206 of the housing 203. In this example, the second processing resource is to disconnect the operating system (OS) and associated OS display driver from the second display 205. In one example of this position, the second processing resource is to provide notification data content to a full area of the second display 205.

In another example, as in above when sixty percent (60%), or some other percent, of a full area of the second display is extended from the pocket 206 in the housing 203, the second processing resource is to share control of content to the second display 205. In the example of a dual sided second display 205, the second processing resource is to share a first portion, e.g. the 60% of the second display 305 extended from the housing 203 outside of the pocket 206, of a first side of the second display 205 with the first processing resource, OS and associated OS display driver to provide content viewable on an inside surface of the housing 203 of the first display. In this example, the second processing resource is to generate graphics and drive content 212 independently to a second portion, e.g., the 40% of the second display 205 remaining in the pocket 206 of the housing 203, on a second side of the second display 205. In this example, the second processing resource is to provide first content, e.g., content within the operating system (OS) environment of the first processing resource, OS, and OS display driver (such as windows, applications, mouse cursor, etc.), to the 60% extension viewable on a first side (e.g., front side) on the inside surface of the housing 203 as an extended workspace to the first display. And, in this example, the second processing resource is to provide different, second content, e.g., notification data content as described herein, to the 40% surface of the second display 205 remaining in the pocket 206 of the housing 203 and viewable on a second side (e.g., rear side) on the outside surface of the housing 203.

In this manner, the second processing resource is to contextually control content between a first side and a second side of the second display 205 based on a position, e.g., 209, 211, and 213, of the second display 205. Examples, however, are not limited to this example. In another example, the second processing resource has a logic unit (shown in FIGS. 3 and 4) and is to receive an input from an application on an operating system (OS) to the logic unit indicating an active or a non-active mode in order to determine content to provide to the second display 205. The second processing resource is to provide content to the second display 205 through a display output combinational switching logic as shown in FIG. 4. As shown in FIG. 5, in one example, the independent second processing resource, e.g., microcontroller, is located within the housing 203 of the first display.

FIG. 3 illustrates an example diagram of a first processing resource 320 allowing notification data content 326 to be passed to a second processing resource 328 to control content to a second display 338 of a computing device 300 while an operating system (OS) display driver 322 associated with the first processing resource 320 is disconnected from the second display 338. As shown in FIG. 3, the second processing resource 328, based on an input received by a logic unit 330 coupled to the second processing resource 328, is to control notification data content 326 passed to the second processing resource 328 from select subsystems (shown as 529 in FIG. 5) within a body portion (shown as 501 in FIG. 5) of the computing device 300 without connecting the OS display driver associated with the first processing resource 320 to the second display 338 or putting the computing device 300 in an active mode. As stated above in relation to FIGS. 1 and 2, the input received by the logic unit 330 is indicative of a position of the second display 338, e.g., a first position (shown as 109 and 209 in FIGS. 1 and 2), a second position (shown as 111 and 211 in FIGS. 1 and 2), or a third position (shown as 113 and 213 in FIGS. 1 and 2). Alternatively, an input as to a mode of the computing device, e.g., "active" or "non-active" mode, may be received to the logic unit 330 from an OS of the computing device 300. Additionally, a signal may be received from a user interface (shown as 103 in FIG. 1) to display the notification data content 326 on the second display 338 regardless of the position of the second display 338.

In the example of FIG. 3, the second processing resource 328 is to generate graphics using a second processing resource graphics engine 332. The graphics engine 332 of the second processing resource 328 can include hardware and firmware in the form of circuitry and logic to generate graphics based on the notification data content 326 allowed to be passed to the second processing resource 328 by the first processing resource 320 while the computing device 300 is in a non-active mode, e.g., "sleep mode". In this example, based on the input received by the logic unit, e.g., the position of the second display 338, or the signal received from the user interface (shown as 103 in FIG. 1), a display output combinational switching logic 334 connects display graphics 336 representing the notification data content 326, generated by the graphics engine 332, to the second display 338. In the example of FIG. 3, the second processing resource 328 is to disconnect from the second display 338 the OS display driver 322 associated with the first processing resource 320 and a converter 324. The second processing resource is 328 to independently provide, based on notification data content 326 received from select subsystems (shown as 529 in FIG. 5), display graphics 336 generated by the graphics engine 332 to the second display 338 via the display output combinational switching logic 334. As used herein, the second processing resource 328 can be a controller (e.g., field programmable gate array (FPGA), multipoint control unit (MCU), etc.) that is separate from a primary processing core, e.g., central processing unit (CPU) in the body portion of the computing device.

FIG. 4 illustrates an example diagram of a first processing resource 420 sharing control of a second display 438 of a computing device 400 with a second processing resource 428 associated with the second display 438 of the computing device 400 via a display output combinational switching logic 434. As shown in the example illustrated in FIG. 4, the first processing resource 420 is associated with an operating system (OS) display driver 422 to provide content while the computing device 400 is in an active mode. A converter 424 is to receive said content from the OS display driver and is to convert the format of the content to an applicable format to be presented on the second display 438. In this example, the converted content is connected by the display output combinational switching logic 434. The output combinational switching logic 434 selects the converted content to be the display graphics 436 that are presented on the second display 438. The converted content may be presented on the second display 438, individually or concurrently, content generated by the second processing resource graphics engine 432.

The first processing resource 420 and a second processing resource 428 are to share control over the second display 438 via the display output combinational switching logic 434. In the example of FIG. 4, a first processing resource 420 is to provide content to a second display 438 as controlled by an operating system (OS) display driver 422, converted to an applicable display format by a converter 424, and selected to be presented by the display output combinational switching logic 434. Concurrently, while a computing device 400 is in an active mode, a second processing resource 428 is to receive notification data content 426 from select subsystems (shown as 529 in FIG. 5), use the second processing resource graphics engine 432 generate graphics based on the notification data content 426, and provide to the second display 438. The generated graphics 436 are connected to the second display 438 via the display output combinational switching logic 434. The display output combinational switching logic 434 will select a location on the second display 438 to present the content provided by the first processing resource and the notification data content provided by the second processing resource based on an input received from a logic unit 430 or a signal received from a user interface (shown as 103 in FIG. 1). As such, the second display 438 may serve as an extended workspace for the computing device 400 for content (shown as 110 in FIG. 1) on a first display (not shown) associated with the first processing resource 420 as well as also serve as the display for the notification data content 426 provided by the second processing resource 428.

In the examples of FIGS. 3 and 4, a location on a second display 338 and 438 where content from an operating system (OS) display driver 322 and 422 and notification data content 326 and 426 are to be displayed may be determined based on whether the second display 338 and 438 is to be dual sided or single sided. As discussed above, if the second display 338 and 438 is dual sided, content from a first processing resource 320 and 420 may be presented on one side and notification data content 326 and 426 may be presented on the other side. If the second display 338 and 438 is single sided, content and notification data content may be displayed on the same side but in separate portions. As described above, sizes of the portions may be based on input received from a logic unit 330 and 430. For example, if sixty percent (60%) of a full area of the second display 338 and 438 has been extended from a pocket (shown as 206 in FIG. 2) in a housing (shown as 203 in FIG. 2) of a first display (shown as 102 in FIG. 1), 60% of the second display 338 and 438 is to present content from the first processing resource 320 and 420, while the other forty percent (40%) is to present the notification data content 326 and 426. The sizes and locations of presentation on the second display 338 and 438 are supplied as examples and are not intended as limiting in any fashion. For example, a signal from a user interface or input from a logic unit may alter the percentages and locations of display to differ from examples herein.

FIG. 5 is a block diagram of an example computing device 500 for display control. In the example shown in FIG. 5, the computing device 500 has a body portion 501 and a housing 505 for a first display 502. As described herein, a display includes hardware in the form of circuitry, logic and a screen, shown as first display 502, to present information visually to a user of the computing device 500. In one example, the computing device 500 is a laptop and the body portion 501 can be the body portion shown as 101 in FIG. 1. Examples, however, are not so limited and the computing device may include a tablet, convertible, or other computing device, etc.

As shown in the example of FIG. 5, the body portion 501 has a first processing resource 520, e.g., primary processing resource, for the computing device 500. In one example the first processing resource 520 is the main processing resource for the computing device 500. The first processing resource 520 is coupled to a first memory resource 507, e.g., primary memory resource, for the computing device 500. The first processing resource can receive input from a user interface 503 on the body portion of the computing device 500. In one example, the user interface 503 can include keys, touch pad, microphone and like, such as the user interface 103 shown in FIG. 1.

The first processing resource 520, in the body portion 501 of the computing device 500, is coupled to an operating system (OS) 521 and operating system (OS) display driver 522, In the example of FIG. 5 the OS 521 and OS display driver 522 are also located in the body portion 501 of the computing device 500. As described herein, the first processing resource 520 connected to the OS 521 and the OS display driver 522 is to control the first display 502 located in the housing 505 of the computing device 500.

The housing 505 includes a second processing resource 528 to control a second display 531. As described herein, the second display 531 is storable in the first display 502. In one example, the second display 531 may be storable in the housing 505 of the first display 502 as shown and described in connection with FIGS. 1 and 2. In another example, the second display 531 may be storable in the housing 505 of the first display 502 as shown and described in connection with FIGS. 6-8. According to examples, the second processing resource 528 can include the second processing resource 328 and 428 shown in FIGS. 3 and 4 and having a logic unit, second processing resource graphics engine (e.g., hardware and firmware render graphics to a display), and content display output combinational switching logic. As described above, the second processing resource 528 can be a controller (e.g., field programmable gate array (FPGA), multi-point control unit (MCU), etc) that is separate from the first processing resource 520, e.g., primary processing core, central processing unit (CPU), etc., in the body portion of the computing device 500.

As shown in the example of FIG. 5, the second processing resource 528 can receive input from a user interface 517 associated with the housing 505. In one example, the user interface 517 is a touch screen to the first display 502. In another example, the user interface is a touch screen to the second display 531. The second processing resource 528 can be coupled to a second memory resource 509, e.g., secondary memory resource. In one example, as shown in FIG. 5, the second memory resource 509 is an independent memory resource from the first memory resource 507. In one example, the second memory resource 509 is located in the housing 505 of the computing device 500. As used herein, the first memory resource 507 and the second memory resource 509 can be volatile or non-volatile memory resources. The second memory resource 509 can be wholly separate from a first memory resource 507.

As described herein, the second processing resource 528 is to control content to the second display 531. The second processing resource 528 is to provide content to the second display 531 independent of the first processing resource 520, the first display 502, and the OS display driver 522, The second processing resource 528 is to provide content to the second display 531 when the computing device is in a non-active mode. In one example, the second processing resource 528 can provide content to the second display 531 when the second display 531 is in a first position stored within a pocket of the housing 505 of the first display 502 as described in connection with FIG. 1. The content provided to the second display 531 by the second processing resource may include notification data content.

For example, the second processing resource 528 can provide content to the second display 531 while the computing device is in sleep mode. In this example, the second processing resource 528 is to disconnect the second display 531 from the OS display driver 522 of the computing device 500. In this example, the second processing resource 528 may connect the second display 531 to a select subsystem 529, e.g., independent network connection, second memory resource, etc., without involvement of the first processing resource 520, the OS 521 or the OS display driver 522. Using a select subsystem 529 connected to the second display 531 via the second processing resource 528, the second processing resource 528 may drive content to the second display 531 that includes date, time, weather, filtered or non-filtered emails, filtered or non-filtered calendar events, appointment notices, or a combination thereof. In this manner, the first processing resource 520 does not have to return to active mode, e.g., wake, to provide content to the second display 531. This in effect may consume less electrical energy and conserve battery life for a computing device 500 that is a mobile computing device 500.

Further, the second processing resource 528 is to share control of the second display 531 with the first processing resource 520 when the second display 531 is in a second position extended from the housing 505 of the first display 502 and while the computing device 500 is in an active mode as described in connection with FIG. 1. In this example, the second processing resource 528 is to switch control of the second display 531 to the first processing resource 520 and associated OS display driver 522 when the second display 531 is extended to the second position as described in connection with FIGS. 1-4 and 6-9B. The second display 531 can be connected to the circuitry, housing 505, body portion 501, and components thereof such as the first processing resource 520 and second processing resource 528, first display 502, etc., by a flexible ribbon connector or other suitable display bus. The OS display driver 522 can then control content to the second display 531 so that content, e.g., within the operating system environment (windows, applications, mouse cursor, etc.) can be moved between the first display 502 and the second display 531.

In one example, the second display 531 is a dual sided display and the second processing resource 528 is to contextually control content between a first side and a second side of the second display 531 based on a position of the second display 531 relative to the housing 505 of the first display 502. For example, the second display 531 may be a dual side emission, organic light emitting diode (OLED) display storable within a pocket of the housing 505 of the first display 502. The second display 531 may be extended to a third position in which some percentage of the full area of the second display 531 is extended from the housing 505 of the first display (shown as 102 in FIG. 1). The second display 531 being in a third position may signal to a logic unit of the second processing resource 528 that the second processing resource 528 is to contextually control content between the first side and the second side of the second display 531.

In this example, the second processing resource 528 is to share control of the second display 531 with the first processing resource 520 and associated OS display driver 522 as described in connection with FIGS. 3 and 4 via a content display output combination switching logic. The OS display driver 522 is to control content to a portion of the first side of the second display 531 as an extension of the first display 502 and the second processing resource 528 is to generate graphics and to drive notification data content to a portion of a second side of the second display 531. For example, if the second display 531 is extended sixty percent (60%) of a full area of the second display 531 from a pocket in the housing 505 of the first display, the OS display driver 522 may control content to an exposed 60% of the first side of the second display 531 as an extension of the first display 502. In this example, the second processing resource 528 is to generate graphics and to drive notification data content to a remaining 40% of a second side of the second display 531 that is not extended from the pocket of the housing 505 of the first display 502 but that may be viewable from an outside surface to the housing 505 of the computing device 500.

In a further example, the first processing resource 520 may extract notification data content from the first memory resource 507 prior to entering a non-active mode. In this example, the second processing resource 528 may receive the notification data content from the first processing resource and store, e.g., cache, the notification data content to the second memory resource 509 such that the second processing resource can control and deliver the notification data content to the second display 531 while the computing device is in a non-active mode, e.g., sleep mode, without having the first processing resource return to an active mode.

In this example, the first display 502 may be in a non-active state and yet the second processing resource can continue to generate graphics and to drive content to the second display 531. The extracted notification data content received by the second processing resource 528 from the first processing resource 520 may include time sensitive data such as calendar notifications, alarm notifications, or other types of notifications that may occur during a non-active mode of the computing device 500.

Figure 6:
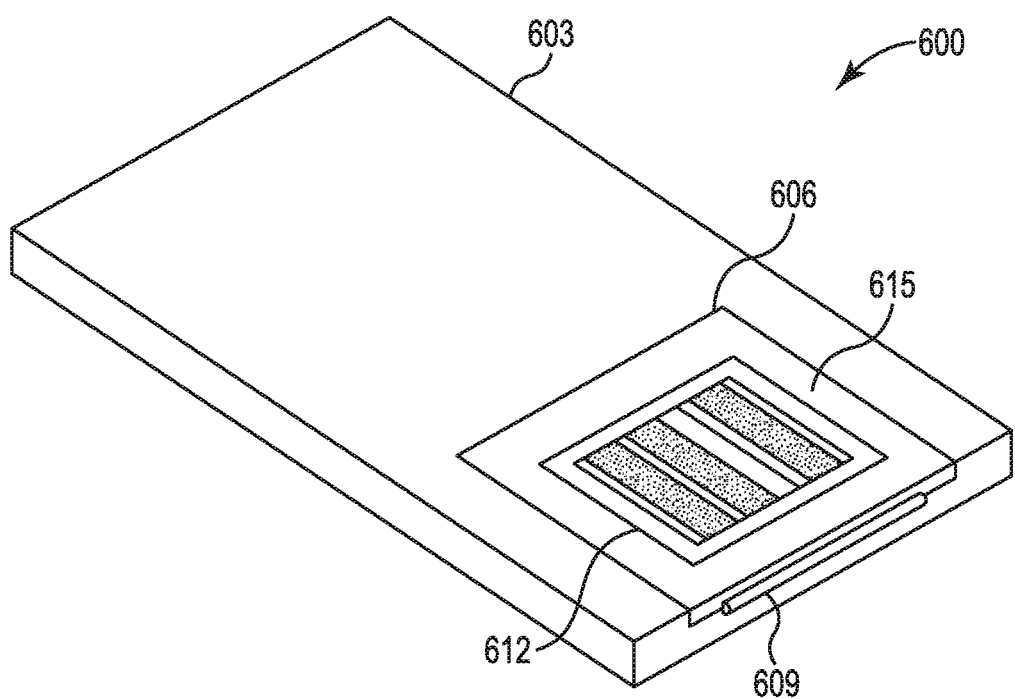
FIG. 6 illustrates an example of a rear view of a computing device in a mechanical configuration of having a single sided second display stored with a hinge within a pocket of a housing of a first display.
Figure 7:
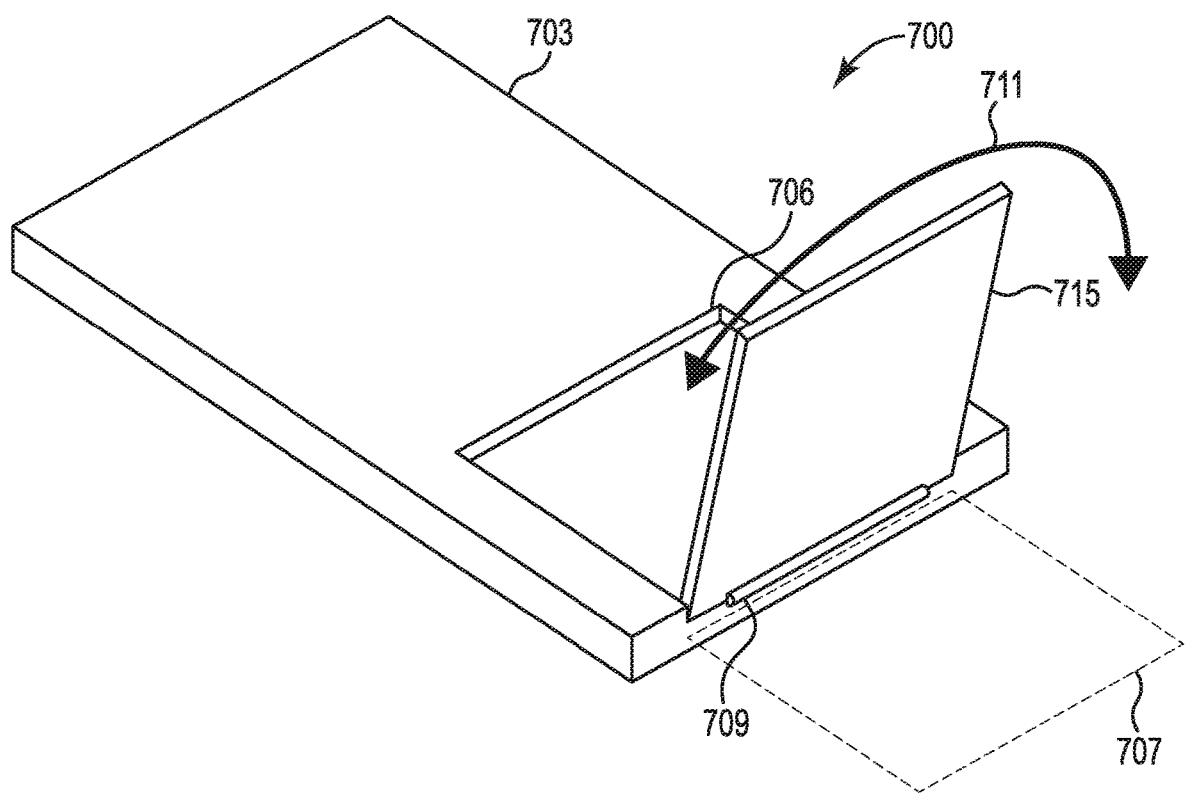
FIG. 7 illustrates an example of a rear view of a computing device in a mechanical configuration of having a single sided second display storable within a pocket of a first display rotating away on a first axis via use of a hinge that attaches the single sided second display to the pocket.
Figure 8:
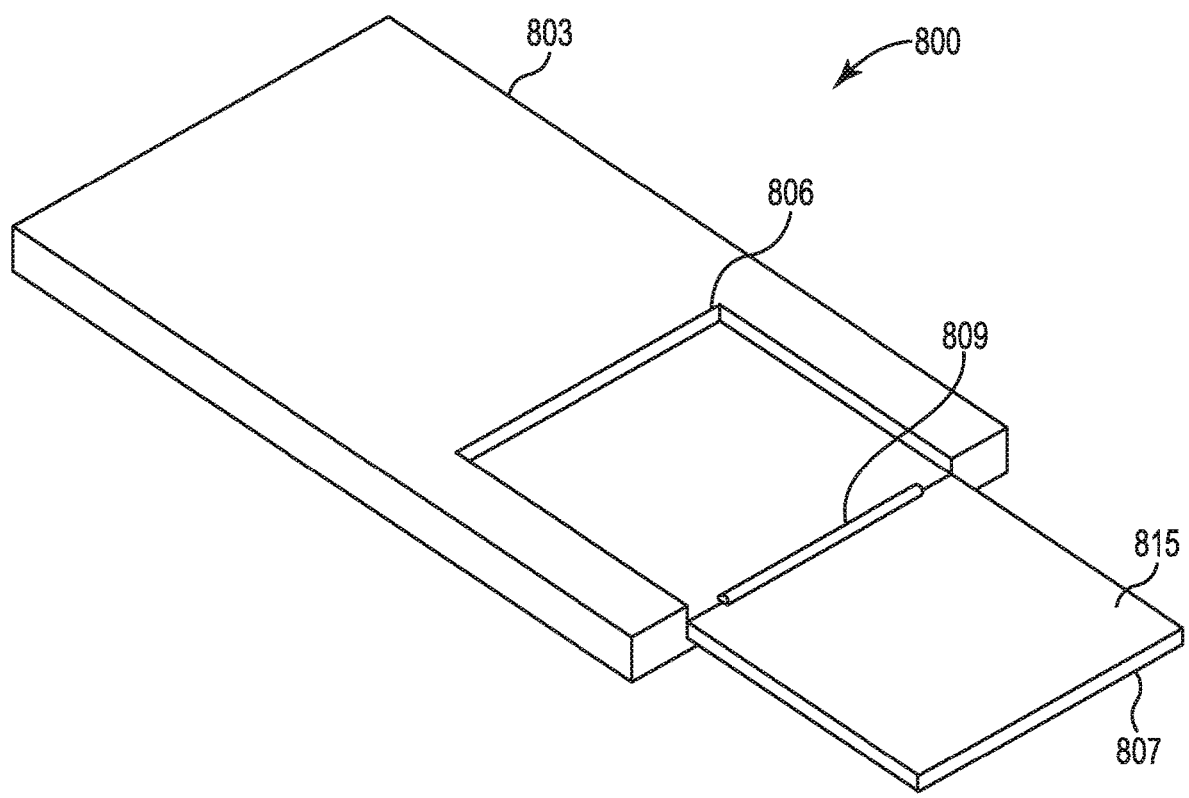
FIG. 8 illustrates an example of a rear view of a computing device in a mechanical configuration of having a single sided second display storable within a pocket of a first display about to rotate on a hinge on a second axis to face a similar direction as the first display.

FIGS. 6, 7, and 8 illustrate an example of a second display movable on a hinge between a first position storable in a pocket to a housing of a first display to a second position extended from the housing for a computing device. The computing device may be in either an active mode or a non-active mode. FIGS. 6, 7, and 8, illustrate an example in which the second display has a single display side and may rotate away from a pocket of a housing of a first display. The single side to the second display may be facing outward and viewable from an outside surface, e.g., rear view, of the housing to the computing device when the second display is rotated to and stored in the pocket of the housing to the first display.

FIG. 6 illustrates an example of a rear view of a computing device 600 in a mechanical configuration of having a single sided second display 615 stored with a hinge 609 within a pocket 606 of a housing of a first display 603. As shown in the example of FIG. 6, the single sided second display 615 is to present notification content 612 based on notification data content (shown as 326 and 426 in FIGS. 3 and 4) provided by a second processing resource (shown as 528 in FIG. 5) while the single sided second display 615 is in the pocket 606 of the housing of the first display 603. As discussed above, while the computing device 600 is in the non-active mode, the second processing resource (shown as 528 in FIG. 5) is to independently generate and provide notification data content (shown as 326 and 426 in FIGS. 3 and 4) allowed by the first processing resource (shown as 520 in Figure) to be passed from select subsystems (shown as 529 in FIG. 5) to the second processing resource (shown as 528 in FIG. 5), which, as a result of being acted upon by the second processing resource (shown as 528 in FIG. 5), is controlled to become shown notification content 612 on the single sided second display 615.

FIG. 7 illustrates an example of a rear view of a computing device 700 in a mechanical configuration of having a single sided second display 715 storable within a pocket 706 of a housing of a first display 703 rotating away on a first axis 711 via use of a hinge 709 that attaches the single sided second display 715 to the pocket 706 of the housing of the first display 703. FIG. 7 relates to FIG. 6 by illustrating an example of the rotatable motion of the second display 715 relative to the housing of the first display 703. As shown in FIG. 7, the single sided second display 715 rotates on a first axis 711, e.g., horizontal axis, from the pocket 706 to a second position 707 away from the housing of the first display 703. The second position 707 of the single sided second display 715 is similar to a second position of a dual sided second display (shown as 111 and 211 in FIGS. 1 and 2). In other words, the single sided second display 715, via use of the hinge 709, is to move from within the pocket 706 to a second position 707 that is fully extended from the housing of the first display 703. As stated above, a display output combinational switching logic (shown as 334 and 434 in FIGS. 3 and 4) is to select whether content from the first display (shown as 110 in FIG. 1) or notification content (shown as 612 in FIG. 6) is presented on the single sided second display 715, As the single sided second display 715 rotates on the first axis 711, a default to be presented is the notification content (as shown by 612 in FIG. 6) until the single sided second display 715 is in the second position 707, facing a same direction as a first display (shown as 104 in FIG. 1).

FIG. 8 illustrates an example of a rear view of a computing device 800 in a mechanical configuration of having a single sided second display 815 storable within a pocket 806 of a housing of a first display 803 rotatable on a hinge 809 to face a similar direction as the first display (shown as 104 in FIG. 1). FIG. 8 illustrates the result of movement from FIGS. 6 and 7 in that the computing device 800 presented in FIG. 8 includes the single sided second display 815 in a second position 807 fully extended from the pocket 806 of the housing of the first display 803 and facing the similar direction as the first display (shown as 104 in FIG. 1).

As illustrated in FIG. 8, the computing device 800 is in an active mode and the single sided second display 815 serves as an extended workspace (shown as 110 in FIG. 1) of a first processing resource (shown as 320, 420, and 520 in FIGS. 3, 4, and 5). In the example of FIG. 8, as the single sided second display 815 rotates, content on the first display (shown as 108 in FIG. 1) includes an area of the single sided second display 815 as an additional area for the content to be presented (shown as 110 in FIG. 1). As stated above, a display output combinational switching logic (shown as 334 and 434 in FIGS. 3 and 4) receives input from a logic unit (shown as 330 and 430 in FIGS. 3 and 4) or a signal from a user interface (shown as 103 in FIG. 1) of whether to present content from the first processing resource (shown as 320, 420, and 520 in FIGS. 3, 4, and 5) or notification content (shown as 612 in FIG. 6) on the single sided second display 815. For example, the display output combinational switching logic (shown as 334 and 434 in FIGS. 3 and 4) can provide the single sided second display 815 with content from the first processing resource (shown as 320, 420, and 520 in FIGS. 3, 4, and 5) or continue providing notification content (shown as 612 in FIG. 6), received from a second processing resource (shown as 328, 428, and 528 in FIGS. 3, 4, and 5) Alternatively, the output switching logic (shown as 334 and 434 in FIGS. 3 and 4) could provide content from the first processing resource (shown as 320, 420, and 520 in FIGS. 3, 4, and 5) in one portion and notification content (shown as 612 in FIG. 6) received from the second processing resource (shown as 328, 428, and 528 in FIGS. 3, 4, and 5) in another portion of the single sided second display 815, as described above in relation to FIG. 4.

Figure 9:
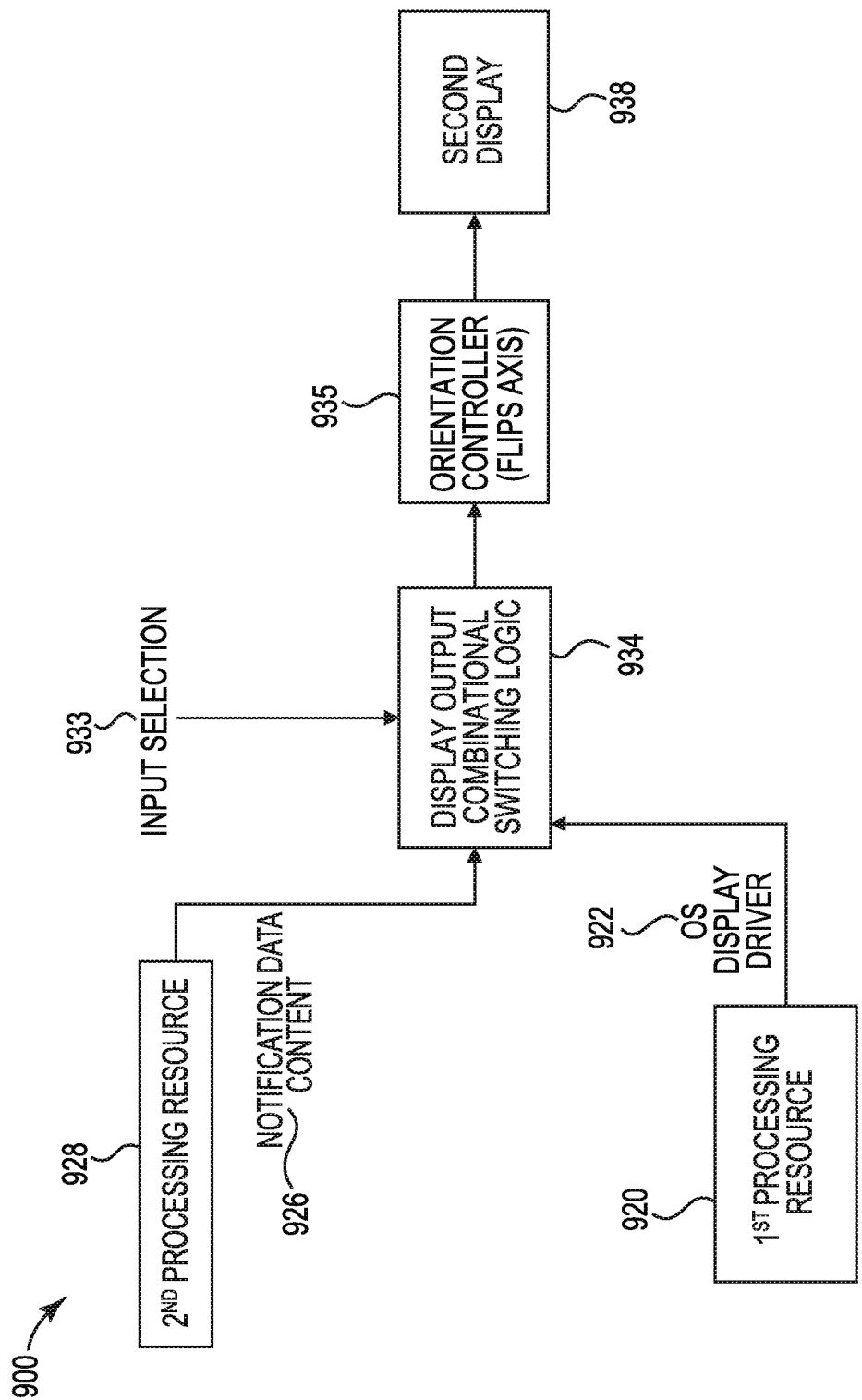
FIG. 9 illustrates an example where a second processing resource is to provide notification data content to a second display via a display output combinational switching logic.

FIG. 9 illustrates an example where a second processing resource 928 is to provide notification data content 926 to a second display 938 via a display output combinational switching logic 934. As shown in FIG. 9, a first processing resource 920 can also provide content generated by an OS display driver 922 to the second display 938 via the display output combinational switching logic 934. Information from a logic unit (shown as 330 and 430 in FIGS. 3 and 4) for input selection 933 is received by the display output combinational switching logic 934 and is transferred to an orientation controller 935 for adjustment (e.g., flip an x axis) of the input selection 933 before being presented on the second display 938, In the example of FIG. 9, the second display 938 is a dual sided display.

As shown in FIG. 9, a computing device 900, may include the first processing resource 920, the operating system (OS) display driver 922, the second processing resource 928, the orientation controller 935, and the second display 938. As stated above in relation to FIGS. 3 and 4, a logic unit (shown as 330 and 430 in FIGS. 3 and 4) may receive input relating to a position, e.g., a first position (shown as 109 and 209 in FIGS. 1 and 2), a second position (shown as 111 and 211 in FIGS. 1 and 2), or a third position (shown as 113 and 213 in FIGS. 1 and 2), of the second display 938. The logic unit (shown as 330 and 430 in FIGS. 3 and 4) may connect this information to the display output combinational switching logic 934 to determine whether the second display 938 is to serve as an extended workspace (shown as 110 in FIG. 1) of the first processing resource 920, or if notification data content 926, coming from the second processing resource 928, is to be displayed on the second display 938 instead. Alternatively, input selection 933 may be a signal received from an operating system based on a mode or state of the computing device 900 (e.g., active, non-active), or from a user interface (shown as 103 in FIG. 1) that may select what is to be displayed where on the second display 938 regardless of the position of the second display 938. Furthermore, in FIG. 9, the display output combinational switching logic 934 may transfer the input selection 933 to the orientation controller 935 for an adjustment (e.g., flip the x axis) based on the input selected 933 to be displayed on the second display 938. For example, the orientation controller 935 is to flip the x axis of the input selection 933 for presentation on a second, dual sided display 938 when the contents (content from the first processing resource, and notification content) switch sides with each other.

Figure 10:
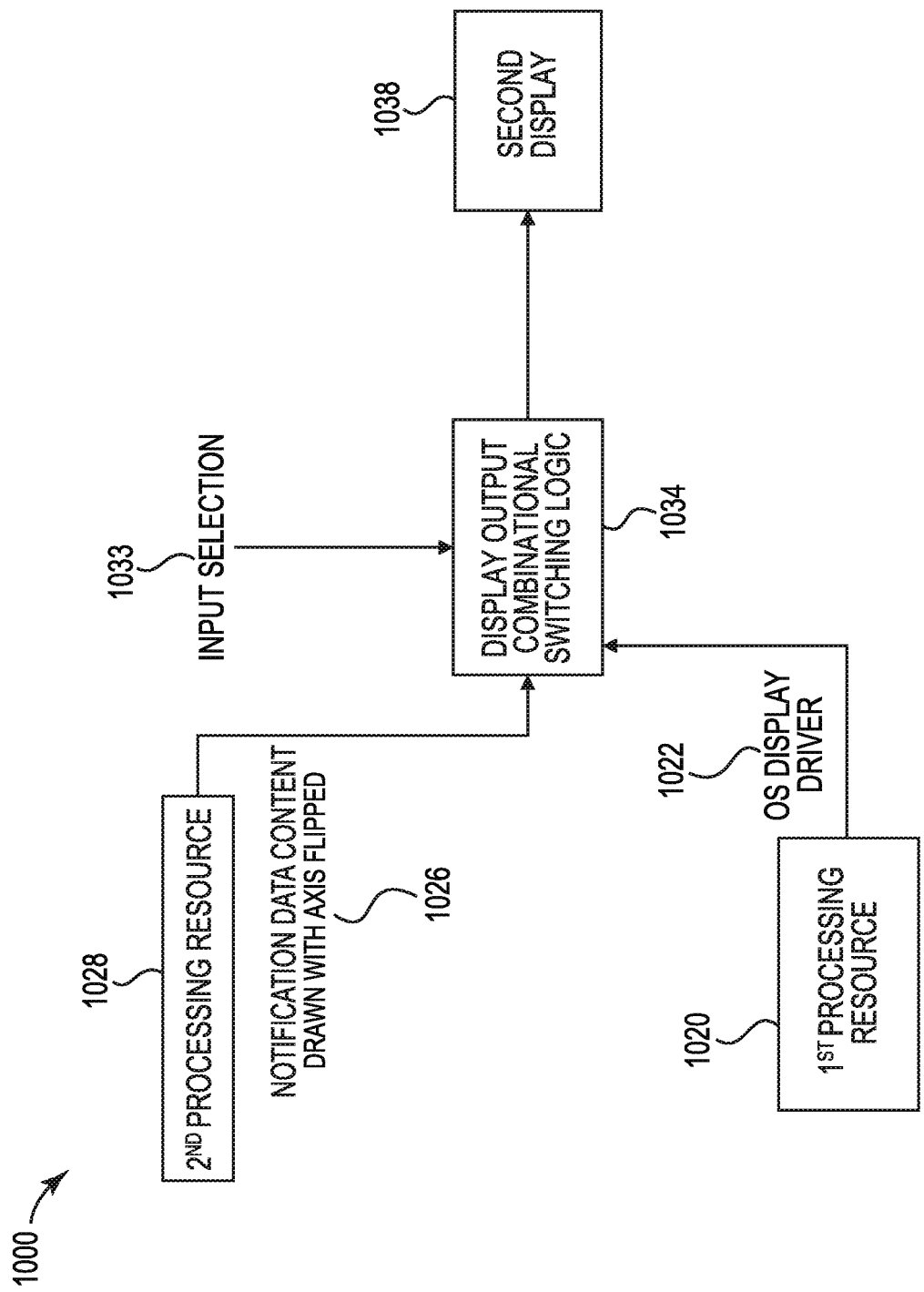
FIG. 10 illustrates an example diagram of a computing device including a second processing resource that is to render content, based on a mode (e.g., active, non-active), for presentation on a second display.

FIG. 10 illustrates an example diagram of a computing device 1000 including a second processing resource 1028 that is to render content, based on a mode (e.g., active, non-active), for presentation on a second display 1038. In the example of FIG. 10, the computing device 1000 includes a first processing resource 1020, an operating system (OS) display driver 1022, a second processing resource 1028, and the second display 1038. The second processing resource 1028 initially renders notification data content 1026 with adjustments (e.g., flipped x axis) having been made. The notification data content 1026 is presented on the second display 1038 based on an input selection 1033 and a display output combinational switching logic 1034.

As stated above for FIG. 9, in the example of FIG. 10, the input selection 1033 relating to presentation on the second display 1038 is determined based on information provided by a logic unit (shown a 334 and 434 in FIGS. 3 and 4) connected to the display output combinational switching logic 1034. Alternatively, input selection 1033 may be a signal received from an operating system based on a mode or state of the computing device 1000 (e.g., active, non-active), or from a user interface (shown as 103 in FIG. 1) that may select what is to be displayed where on the second display 1038 regardless of the position of the second display 1038. Once the input selection 1033 has been made, the input selection 1033 can be presented on the second display 1038 via connection to the display output combinational switching logic 1034. In the example of FIG. 10, orientation adjustments required (e.g., flipped x axis) for presentation of the notification data content 1026 on the second display 1038 may be made when the notification data content 1026 is initially rendered by the second processing resource 1028. For example, the second processing resource 1028 can initially draw the notification data content 1026 with the x axis flipped for presentation on the second display 1038.

All examples in all Figures stated above are intended to be non-limiting.

What is claimed:

1. A computing device comprising:
a first processing resource to:
control content displayed on a first display; and
control content displayed on a first side of a second display when the second display is in a first position extended from a pocket of the first display, wherein the first processing resource is to control content to a portion of the first side of the second display as an extension of the first display; and
a second processing resource to:
control content displayed on a second side of the second display when the second display is in a second position within the pocket of the first display, wherein the second processing resource is to provide notification content to the second side of the second display while the first processing resource of the computing device is in a non-active mode; and
control content displayed on the first side and the second side of the second display with the first processing resource when the second display is in the first position and the first processing resource of the computing device is in an active mode, wherein the second processing resource is to share control of the second display with the first processing resource when the second display is in a second position extended from the first display and while the computing device is in an active mode.

2. The computing device of claim 1, wherein the second processing resource is to disconnect the second display from an operating system (OS) display driver of the computing device while the computing device is in the non-active mode.

3. The computing device of claim 1, wherein the second processing resource is to selectively connect to a subsystem of the computing device to the second display while remaining subsystems of the computing device including the first processing resource and the first display are in the non-active mode.

4. The computing device of claim 1, wherein:
the second processing resource is to switch control of the second display to an operating system (OS) display driver when the second display is extended to the second position, wherein the OS display driver is controlled by the first processing resource; and
wherein the OS display driver is to control content to the first display and the second display in the second position so that content can be moved between the first display and the second display.

5. The computing device of claim 1, wherein the second display is a dual side emission, organic light emitting diode (OLED) display.

6. The computing device of claim 1, wherein the second processing resource is to drive notification data content that includes date, time, weather, filtered or non-filtered emails, filtered or non-filtered calendar events, appointment notices, or a combination thereof.

7. An apparatus comprising:
a first processing resource to:
control content displayed on a first display; and
control content displayed on a first side of a second display when the second display is in a first position extended, by a hinge that couples the first display to the second display, from a pocket of a housing of the first display, wherein the first processing resource is to control content to a portion of the first side of the second display as an extension of the first display; and;
a second processing resource to:
control content displayed on a second side of the second display when the second display is in a second position within the pocket of the housing of the first display, wherein the second processing resource is to provide notification content to the second side of the second display while the first processing resource is in a non-active mode; and
control content displayed on the first side and the second side of the second display with the first processing resource when the second display is in the first position and the first processing resource is in an active mode, wherein the second processing resource is to share control of the second display with the first processing resource when the second display is in a second position extended from the first display and while the computing device is in an active mode.

8. The apparatus of claim 7, wherein the second processing resource is to:
disconnect the second display from an operating system (OS) display driver when the second display is positioned in the pocket of the housing of the first display and oriented opposite facing from the first display, wherein the OS display driver is associated with the first processing resource; and
switch control of the second display to the OS display driver associated with the first processing resource when the second display is rotated to a same facing position as the first display so that content is moved between the first display and the second display.

9. The apparatus of claim 7, wherein a combinational switching logic circuit associated with the second processing resource is to disconnect the second display from an operating system (OS) driver and connect the second display to a select subsystem of the apparatus based on a position input from the hinge.

10. The apparatus of claim 9, wherein the second processing resource is to independently generate graphics and to drive content to the second display from the select subsystem while the apparatus is in non-active mode.

11. A computing device comprising:
a first processing resource to:
control content displayed on a first display; and
control content displayed on a first side of a dual sided second display when the dual sided second display is in a first position extended, by a hinge that couples the first display to the dual sided second display, from a pocket of a housing of the first display, wherein the first processing resource is to control content to a portion of the first side of the dual sided second display as an extension of the first display; and
a second processing resource to:
control content displayed on a second side of the dual sided second display when the dual sided second display is in a second position within the pocket of the housing of the first display, wherein the second processing resource is to provide notification content to the second side of the dual sided second display while the first processing resource of the computing device is in a non-active mode; and
control content displayed on the first side and the second side of the dual sided second display with the first processing resource when the dual sided second display is in the first position and the first processing resource of the computing device is in an active mode, wherein the second processing resource is to share control of the dual sided second display with the first processing resource when the dual sided second display is in a second position extended from the first display and while the computing device is in an active mode.

12. The computing device of claim 11, wherein the second processing resource is to:
provide notification content to the first side of the dual sided display while stored in the pocket of the first display in a manner viewable from an outside surface of the first display;
pass control of the dual sided second display to the first processing resource and an OS display driver to provide content to the second side of the dual sided second display as an extension of the first display; and
wherein the content provided to the second side of the dual sided second display is viewable from an inside surface of the first display when the dual sided second display is extended from the pocket of the first display.

13. The computing device of claim 11, wherein:
the first processing resource is a primary processing resource located in a body of the computing device;
the second processing resource is smaller and uses less electrical energy than the first processing resource; and
the second processing resource is to connect the dual sided second display only to a subsystem of the computing device while the computing device is in the non-active mode.

14. The computing device of claim 11, wherein the second processing resource is to disconnect the first processing resource, an OS display driver and the first display when the computing device is in the non-active mode.

* * * * *